(12) United States Patent
Lee et al.

(10) Patent No.: US 9,709,893 B2
(45) Date of Patent: Jul. 18, 2017

(54) EXPOSURE METHOD USING ELECTRON BEAM AND SUBSTRATE MANUFACTURING METHOD USING THE SAME

(71) Applicant: SAMSUNG ELECTRONICS CO., LTD., Suwon-si, Gyeonggi-do (KR)

(72) Inventors: Sook Hyun Lee, Hwaseong-si (KR); Shuichi Tamamushi, Hwaseong-si (KR); So-Eun Shin, Hwaseong-si (KR); Inkyun Shin, Yongin-si (KR); Jin Choi, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/990,818

(22) Filed: Jan. 8, 2016

(65) Prior Publication Data
US 2016/0223903 A1    Aug. 4, 2016

(30) Foreign Application Priority Data

Feb. 2, 2015  (KR) .......................... 10-2015-0016178

(51) Int. Cl.
*B44C 1/22*     (2006.01)
*G03F 7/32*     (2006.01)
*G03F 1/36*     (2012.01)
*G03F 1/78*     (2012.01)

(52) U.S. Cl.
CPC .................. *G03F 7/32* (2013.01); *G03F 1/36* (2013.01); *G03F 1/78* (2013.01)

(58) Field of Classification Search
CPC ... G02B 27/32; G03F 1/80; G03F 1/70; G03F 7/32; G03F 7/36; G03F 1/72; G03F 1/76; G03F 1/74; G03F 1/78

USPC ............... 216/41, 48, 49; 430/296, 297, 313
See application file for complete search history.

(56) References Cited

U.S. PATENT DOCUMENTS

| | | | |
|---|---|---|---|
| 5,863,682 A * | 1/1999 | Abe | B82Y 10/00 250/492.2 |
| 7,124,394 B1 | 10/2006 | Abrams et al. | |
| 7,178,127 B2 | 2/2007 | Abrams et al. | |
| 7,463,173 B2 | 12/2008 | Sanmiya et al. | |
| 7,480,889 B2 | 1/2009 | Abrams et al. | |
| 7,571,423 B2 | 8/2009 | Abrams et al. | |
| 7,715,641 B2 * | 5/2010 | Olsson | G03F 1/76 358/3.01 |

(Continued)

FOREIGN PATENT DOCUMENTS

| | | |
|---|---|---|
| JP | H03249650 A | 11/1991 |
| JP | 2002216684 A | 8/2002 |

(Continued)

*Primary Examiner* — Lan Vinh
(74) *Attorney, Agent, or Firm* — Volentine & Whitt, PLLC

(57) ABSTRACT

An exposure method includes designing a target pattern to be formed on a substrate, producing a first dose map having first dose values of beams of energy, e.g., electron beams, creating from the first dose map a second dose map having second dose values different from the first dose values, and irradiating regions of a layer of photoresist on the substrate with overlapping beams to expose the regions to doses of energy having values based on the second dose values. The photoresist layer may then be developed and used an etch mask. The etch mask may be used to etch a mask layer on a transparent substrate to form a reticle.

18 Claims, 17 Drawing Sheets

(56) References Cited

U.S. PATENT DOCUMENTS

| | | |
|---|---|---|
| 7,899,953 B2 | 3/2011 | Inoue |
| 8,076,656 B2 | 12/2011 | Shibata |
| 8,103,980 B2 | 1/2012 | Emi et al. |
| 8,160,350 B2 | 4/2012 | Yishai et al. |
| 8,255,441 B2 | 8/2012 | Kasahara et al. |
| 8,455,159 B2 | 6/2013 | Ryu |
| 8,492,055 B2 | 7/2013 | Zable et al. |
| 8,584,056 B2 | 11/2013 | Chen et al. |
| 8,635,562 B2 | 1/2014 | Sahouria |
| 8,745,549 B2 * | 6/2014 | Fujimura .............. G03F 1/36 716/50 |
| 2004/0036860 A1 | 2/2004 | Hiruta |
| 2009/0190118 A1 | 7/2009 | Fukuhara |
| 2010/0216061 A1 | 8/2010 | Hendrickx et al. |
| 2011/0253911 A1 * | 10/2011 | Matsumoto ........... B82Y 10/00 250/492.3 |
| 2013/0014065 A1 | 1/2013 | Feng et al. |
| 2013/0075813 A1 * | 3/2013 | Kadoya ............ H01L 29/66666 257/330 |
| 2013/0179847 A1 * | 7/2013 | Hansen ................ G06F 17/50 716/54 |
| 2013/0227500 A1 | 8/2013 | Sakajiri et al. |
| 2014/0129997 A1 | 5/2014 | Fujimura et al. |
| 2014/0146311 A1 | 5/2014 | Mikami |
| 2014/0229904 A1 | 8/2014 | Fujimura et al. |
| 2014/0244215 A1 | 8/2014 | Nakayama et al. |

FOREIGN PATENT DOCUMENTS

| | | |
|---|---|---|
| JP | 2003272989 A | 9/2003 |
| JP | 2008129035 A | 6/2008 |
| KR | 20090114249 A | 11/2009 |

\* cited by examiner

FIG. 14

EXPOSURE METHOD USING ELECTRON BEAM AND SUBSTRATE MANUFACTURING METHOD USING THE SAME

PRIORITY STATEMENT

This U.S. nonprovisional patent application claims priority under 35 U.S.C. §119 of Korean Patent Application 10-2015-0016178 filed on Feb. 2, 2015, the entire contents of which are hereby incorporated by reference.

BACKGROUND

The present inventive concept relates to semiconductor device fabrication or the like. More particularly, the inventive concept relates to processes for use in and a method of manufacturing articles, such as reticles, using beams of energy.

Semiconductor devices are generally fabricated on a wafer by a plurality of unit processes such as a thin film deposition process, a photolithography process, an etch process, etc. The photolithography process is employed to transcribe a pattern of a photomask (sometimes referred to in the art as a reticle) onto the wafer. The photolithography process is performed by an exposure apparatus including an I-line, G-line, KrF, or ArF light source. A photosensitive layer, namely, a layer of photoresist, is formed on the wafer, and light emitted from the light source is transmitted onto the layer of photoresist through the photomask in an exposure process. In this case, an image of the pattern of the photomask is transferred to the layer of photoresist. The layer of photoresist is then developed to remove the exposed or non-exposed portion of the layer such that the resulting layer of photoresist bears a pattern corresponding to that of the photomask.

The mask pattern, i.e., the pattern of the photomask itself, is formed by a similar method. In this case, though, an electron beam is typically used in an exposure process of forming the mask pattern.

SUMMARY

According to an aspect of the inventive concepts, there is provided an exposure method comprising providing a substrate having a layer of photoresist thereon, designing a target pattern to be formed on the substrate, creating a first dose map of first values, wherein the first values are representative of doses of energy of beams emitted by a light source of an exposure apparatus, and the first dose map includes a representation of a corrected version of the target pattern, creating a second dose map of second values, different from the first values, wherein at least some of the second values correspond to values of doses of energy produced by overlapping ones of the beams, and controlling the light source of the exposure apparatus to irradiate respective regions of the layer of photoresist in such a way that said respective regions are exposed to doses of energy having values based on the second values to thereby alter said regions of the layer of photoresist.

According to another aspect of the inventive concepts, there is provided a method of manufacture comprising forming a layer of photoresist on a substrate, exposing the photoresist to beams of energy emitted by a light source of an exposure apparatus, and developing the exposed photoresist to form a photoresist pattern, and in which the exposing of the photoresist includes: designing a target pattern to be formed on the substrate, creating a first dose map of first values, wherein the first values are representative of doses of energy of individual ones of beams emitted by the light source of the exposure apparatus, and the first dose map includes a representation of a corrected version of the target pattern, creating a second dose map of second values, different from the first values, wherein at least some of the second values correspond to values of doses of energy produced by overlapping ones of the beams, and controlling the light source of the exposure apparatus to irradiate respective regions of the layer of photoresist in such a way that said respective regions are exposed to doses of energy having values based on the second values.

According to still another aspect of the inventive concepts, there is provided a method of manufacturing a reticle, comprising providing a transparent substrate having a mask layer thereon, and a layer of photoresist on the mask layer, exposing the layer of photoresist to beams of energy emitted by a light source of an exposure apparatus, developing the exposed photoresist to form a photoresist pattern, and etching the mask layer, using the photoresist pattern as an etch mask, to form a mask pattern on the substrate, and in which the exposing of the layer of photoresist includes: designing a target pattern to be formed on the substrate as the mask pattern, creating a first dose map of first values, wherein the first values are representative of doses of energy of individual ones of beams emitted by the light source of the exposure apparatus, and the first dose map includes a representation of a corrected version of the target pattern, creating a second dose map of second values, different from the first values, wherein at least some of the second values correspond to values of doses of energy produced by overlapping ones of the beams, and controlling the light source of the exposure apparatus to irradiate respective regions of the layer of photoresist in such a way that said respective regions are exposed to doses of energy having values based on the second values.

BRIEF DESCRIPTION OF THE DRAWINGS

The foregoing and other features and advantages of the inventive concepts will become more apparent from the detailed description of non-limiting examples of the inventive concepts that follows, as illustrated in the accompanying drawings in which like reference characters designate like parts throughout the different views. The drawings are not necessarily to scale, emphasis instead being placed upon illustrating the principles of inventive concepts. In the drawings:

FIGS. 11 and 12 respectively illustrate a first exposure pattern and a first dose map in the MBMW exposure correction method of FIG. 10;

FIGS. 13 and 14 respectively illustrate a second exposure pattern and a second dose map created by the MBMW exposure correction method of FIG. 10;

DETAILED DESCRIPTION

Figure 1:
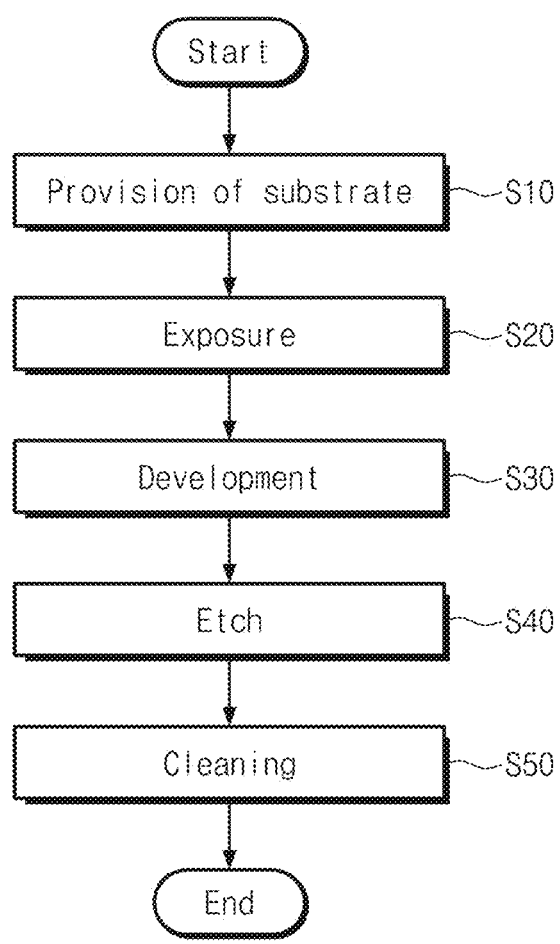
FIG. 1 is a flow chart of a method of manufacture including an exposure process using ion beams.

Examples of the inventive concept will now be described more fully hereinafter with reference to the accompanying drawings. The inventive concept may, however, be exemplified in many different forms and should not be construed as being limited to the examples described herein; rather, these example examples are provided so that this disclosure will be thorough and complete, and will fully convey the inventive concept to those of ordinary skill in the art. In the drawings, the thicknesses of layers and regions are exaggerated for clarity.

Terminology used herein for the purpose of describing particular examples of the inventive concept is to be taken in context. Thus, for example, the terms "comprises" or "comprising" when used in this specification specifies the presence of stated features or processes but does not preclude the presence or additional features or processes. The term "energy" will be understood as referring to the energy of radiation such as that of an electron beam. The term "photoresist" will be understood as any of various known substances capable of undergoing a reaction when exposed to radiation of a particular type and whose energy exceeds a certain threshold. The term "transparent" will be understood as referring to a characteristic of transmitting radiation of a certain type.

A method of manufacture according to the inventive concept will now be described with reference to the flowchart of FIG. 1 and the cross-sectional views of FIGS. 2 to 6.

Figure 2:
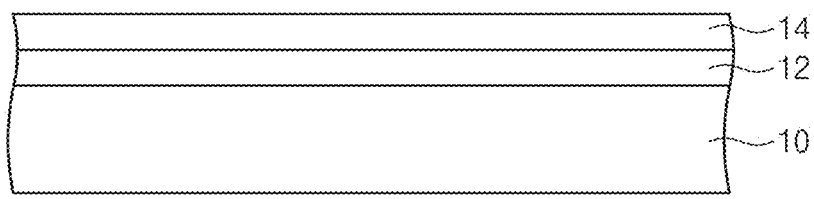
FIGS. 2 to 6 are cross-sectional views of a photomask or reticle during the course of its manufacture according to the method of FIG. 1.

Referring to FIGS. 1 and 2, a substrate 10 may be provided (S10). The substrate 10 may be transparent. For example, the transparent substrate may be a glass or plastic substrate. A mask layer 12 and a layer of photoresist 14 may be sequentially formed on the substrate 10. The mask layer 12 may be a layer of chromium formed by a sputtering process or an electroplating process. The layer of photoresist 14 may be formed by a spin coating process.

Figure 3:
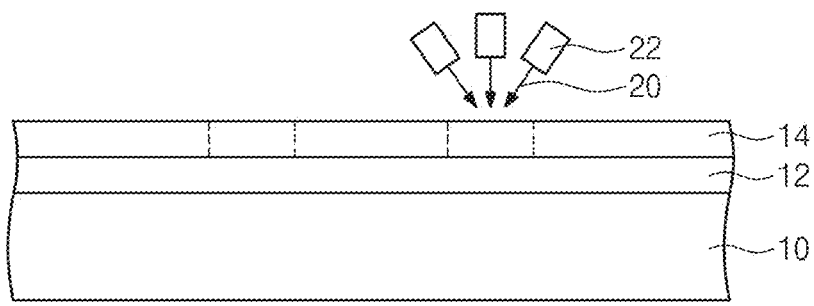

Referring to FIGS. 1 and 3, an exposure process may be performed on the photoresist 14 (S20). More specifically, the photoresist 14 may be exposed to beams 20, e.g., electron beams. The beams 20 may be emitted from electron guns 22.

Figure 4:
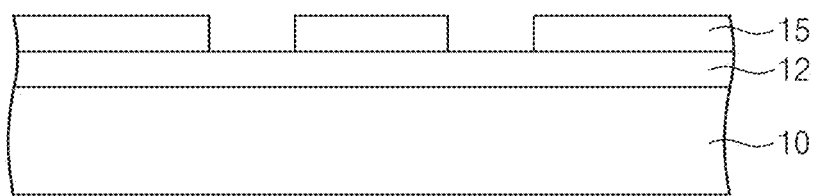

Referring to FIGS. 1 and 4, the exposed photoresist 14 may be developed to form a photoresist pattern 15 (S30). The photoresist pattern 15 may partially expose the mask layer 12.

Figure 5:
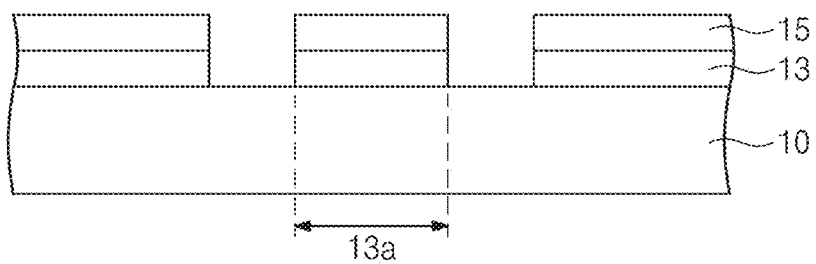

Referring to FIGS. 1 and 5, the mask layer 12 may be etched using the photoresist pattern 15 as an etch mask to form a mask pattern 13 (S40). The mask pattern 13 may have a minimum line width 13a.

Figure 6:
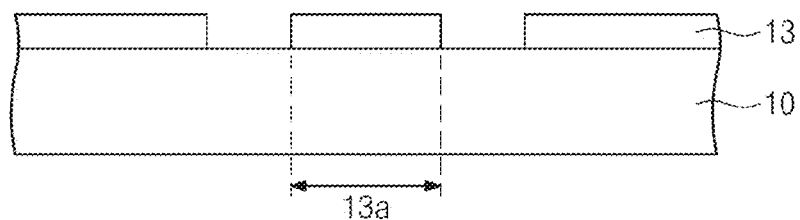

Referring to FIGS. 1 and 6, the photoresist pattern 15 may be removed (S50). The resulting article of manufacture may be a photomask or reticle of the type employed by an exposure apparatus such as a scanner or a stepper. For purposes of description only, reference will be made hereinafter to the reticle.

Figure 7:
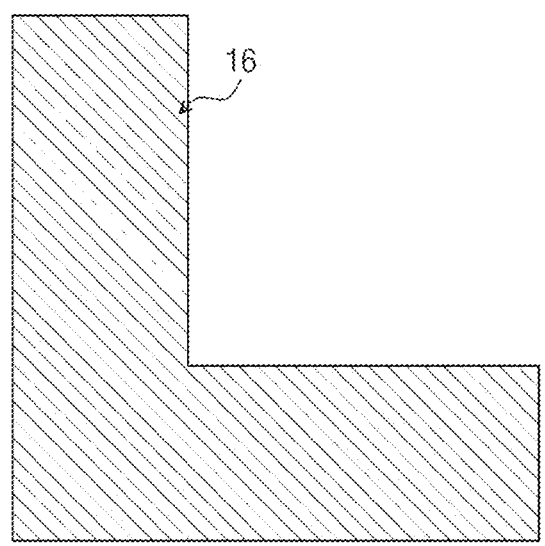
FIG. 7 is a diagram of a target pattern for the photomask or reticle of FIG. 6.

FIG. 7 illustrates an example of a target pattern 16 of the reticle of FIG. 6, i.e., an example of an actual pattern which is to be formed using the reticle in a lithography process.

Referring to FIGS. 3 and 7, the mask pattern 13 is intended to correspond to the target pattern 16. In a case in which the target pattern 16 has a micro-line width, the shape of the mask pattern 13 may differ from that of the target pattern 16 because of small or minor processing errors inherent in the processes (namely, the exposure and etch processes) used in forming the reticle. For example, most but not all of the mask pattern 13 may have the micro-line width of the target pattern 16. It thus may be necessary to calibrate or correct the mask pattern 13 for improving fidelity between the target pattern 16 and the actual pattern formed (not shown) using the reticle. To this end, for example, the mask pattern 13 may be formed or corrected by a variable shaped beam (VSB) or multi-beam mask writer (MBMW) exposure method.

Figure 8:
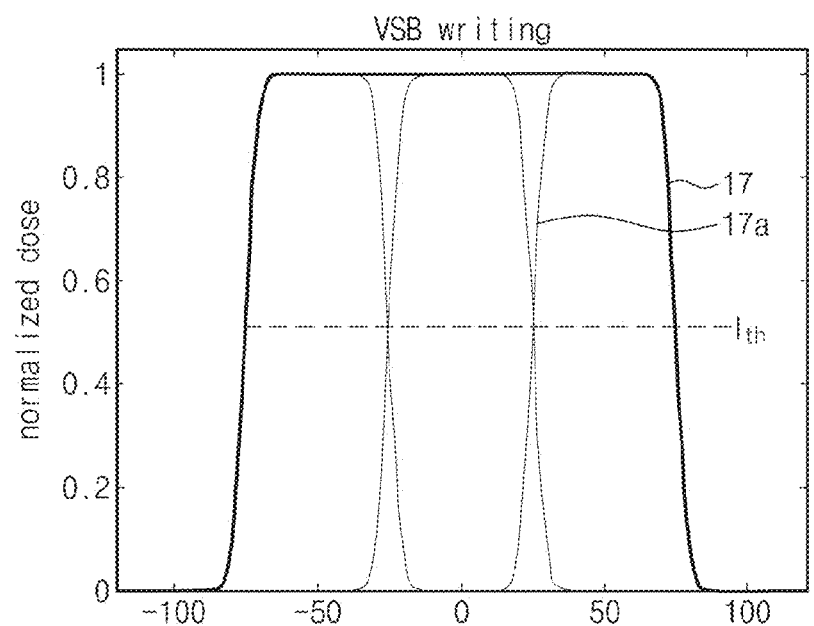
FIG. 8 is a graph illustrating a VSB exposure correction method.

FIG. 8 is a graph illustrating a VSB exposure correction method. In the graph, distance in units of nm along the path that the VSB is tracing is plotted along the horizontal axis and a normalized dose of the VSB is plotted along the vertical axis.

Referring to FIGS. 3, 7 and 8, a VSB exposure correction method may be performed in such a way that a dose from a beam 20 is introduced over every unit distance in the process of exposing the photoresist (S20 in FIG. 1) according to the target pattern 16. The unit distance may be about 50 nm and the respective doses 17*a* of the beam 20 over the unit distances may have normalized values of 1. The exposure process is controlled, i.e., the sources of the beams 20 are controlled, so that the normalized value of the total dose 17 at each location over the course of exposing the photoresist on the substrate according to the target pattern 16 may be 1. The normalized value of the dose of the beams 20 at a region of the photoresist outside of the target pattern 16 may be 0. Alternatively, the VSB exposure correction method may be performed in unit areas or unit figures instead of over unit distances. Another correction method entail changing or redesigning the target pattern 16 through experimentation to improve fidelity between the desired and actual patterns formed (not shown) using the reticle.

Figure 9:
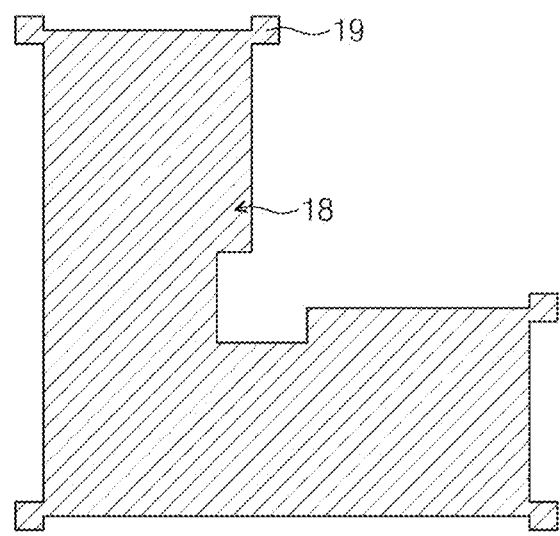
FIG. 9 is a diagram of an example of a VSB-corrected exposure pattern created using the VSB exposure correction method of FIG. 8.

FIG. 9 illustrates an example of a VSB-corrected pattern 18 produced by a VSB exposure correction method.

Referring to FIGS. 7 and 9, the VSB exposure correction method may transform the target pattern 16 into a VSB-corrected exposure pattern 18. The VSB-corrected exposure pattern 18 may comprise at least one exposure point 19. Each exposure point 19 may be disposed at a location in the VSB-corrected exposure pattern 18 corresponding to a corner of the target pattern 16. Thus, at least one edge of the VSB-corrected exposure pattern 18 may be wider than that of the target pattern 16. A normalized value of the dose used to create the VSB-corrected exposure pattern 18 may be 1 and a normalize value of the dose in regions corresponding to the outside of the VSB-corrected exposure pattern 18 may be 0.

Figure 10:
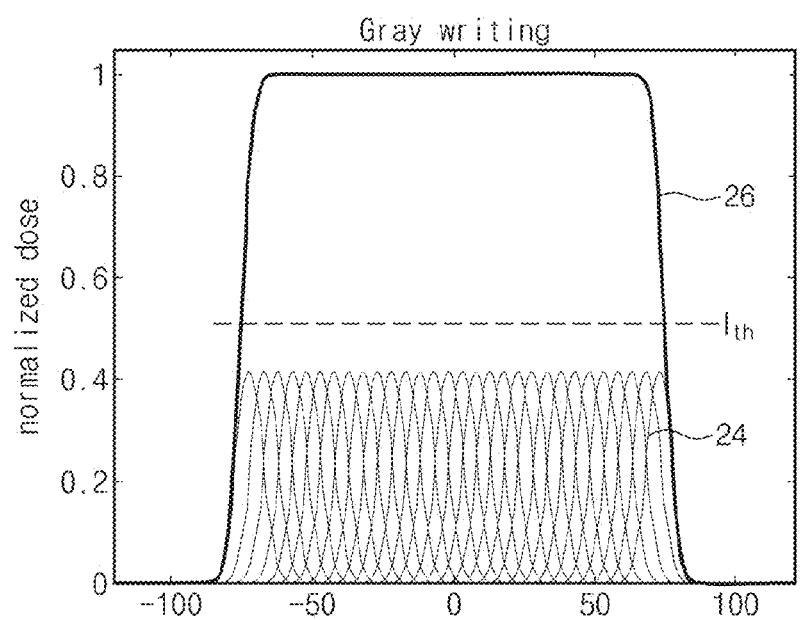
FIG. 10 is a graph illustrating an example of an MBMW exposure method according to the inventive concepts.

FIG. 10 is a graph illustrating an example of a MBMW exposure method.

Referring to FIGS. 3 and 10, an MBMW exposure correction method may be performed in such a way that the beams 20 overlap. The normalized values of the doses 24 of each of the beams 20 are less than 0.5, for example. Here, dose may refer to intensity of the beam. Each of the beams 20 may be allowed to have any of thousands of different respective values. In any case, the total normalized value of the dose 26 at points along the photoresist as it is being exposed may be greater than the respective dose values 24. The total normalized value of the dose 26 may be 1. The MBMW exposure correction method may thus be characterized as an exposure process having enhanced granularity.

Figure 11:
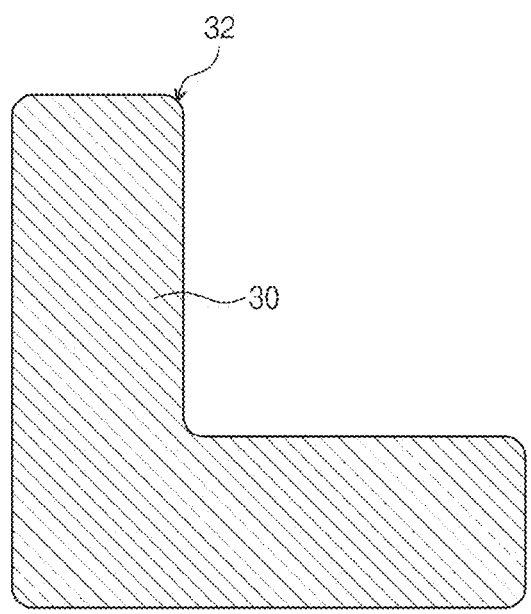
Figures 12, 13:
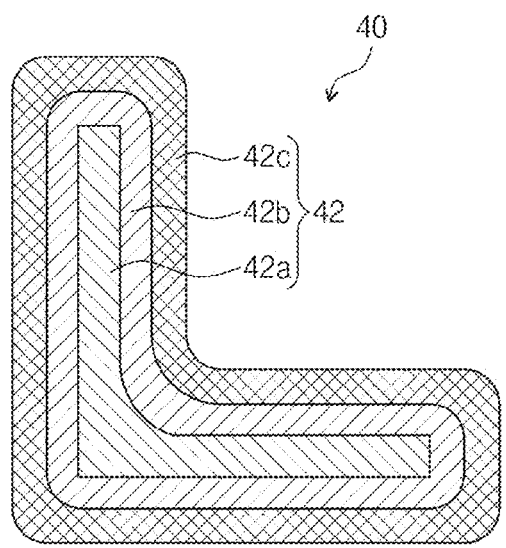

FIGS. 11 and 12 respectively illustrate a first exposure pattern 30 and a first dose map 34, in a process in which the target pattern 16 of FIG. 7 is corrected by an MBMW exposure correction method of the type described above with respect to FIG. 10.

That is, referring to FIGS. 7, 10 and 11, the MBMW exposure method may recalibrate or offer a correction of the target pattern 16 to form the first exposure pattern 30. The first exposure pattern 30 may have rounded corners 32 in contrast to the target pattern 16. The total dose 26 used to form substantially any portion of the first exposure pattern 30 may have a normalized value of 1.

Referring to FIG. 12, the first exposure pattern 30 may be represented by the first dose map 34. The first dose map 34 may comprise a plurality of 1-valued unit cells 36 and a plurality of 0-valued unit cells 38. The first exposure pattern 30 may consist of the 1-valued unit cells 36. The 1-valued unit cells 36 may collectively have a shape substantially identical to that of the first exposure pattern 30. Alternatively, the 1-valued unit cells 36 may collectively have a shape substantially identical to that of the target pattern 16. The 1-valued unit cells 36 correspond to regions exposed by the beams 20 at a dose value of 1. The dose value of 1 may be a normalized value of the intensity of the beam. The 0-valued unit cells 38 may have a dose value of 0. Therefore, the 0-valued unit cells 38 may correspond to regions not irradiated by any of the beams 20.

Figure 14:
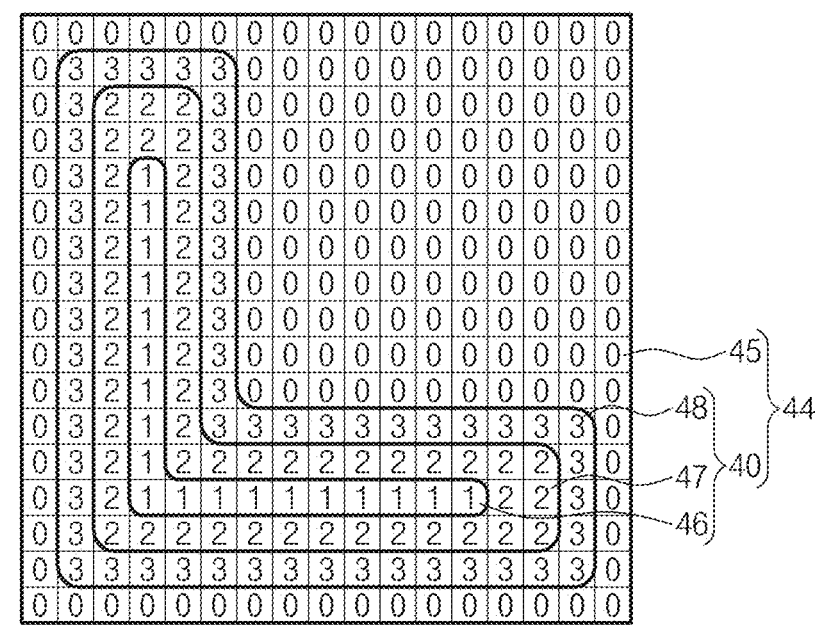

FIGS. 13 and 14 respectively illustrate a second exposure pattern 40 and a second dose map 44, in the MBMW exposure correction method.

Referring to FIGS. 3, 7 and 10 to 13, the MBMW exposure correction method may correct the first exposure pattern 30 to form the second exposure pattern 40. The second exposure pattern 40 may be produced by overlapping beams 20 having the respective dose values 24. The second exposure pattern 40 may thus be produced by exposing regions of the photoresist to total doses whose normalized values differ from those used in forming the first exposure pattern 30, i.e., differ from the normalized dose values of 1 and 0. That is, the second exposure pattern 40 may comprise a plurality of dose regions 42 formed by being exposed to different doses. The dose regions 42 may include a first dose region 42*a*, a second dose region 42*b*, and a third dose region 42*c*. The first to third dose regions 42*a* to 42*c* may be sequentially arranged toward an outside from an inside of the second exposure pattern 40. For example, the first dose region 42*a* may be disposed in the second and third dose regions 42*b* and 42*c*. Each of the second and third dose regions 42*b* and 42*c* may be produced by a dose of a value greater than that used to form the first dose region 42*a*. The second dose region 42*b* may be disposed in the third dose region 42*c*. The third dose region 42*c* may be disposed on an outermost portion of the second exposure pattern 40. The third dose region 42*c* may be formed by a dose of a value greater than that used to form the second dose region 42*b*. The inventive concepts, however, are not limited to such an example of the various dose regions. Rather, the dose regions 42 of the second exposure pattern 40 may be characterized as comprising first to $n^{th}$ dose regions wherein n is a natural number greater than 1.

Referring to FIGS. 3, and 12 to 14, the second exposure pattern 40 may be represented by the second dose map 44. Therefore, the second dose map 44 may comprise a plurality of unit cells 45 each having a value of 0, a plurality of unit cells 46 each having a value of 1, a plurality of unit cells 47 each having a value of 2, and a plurality of unit cells 48 each having a value of 3. The 1-valued unit cells 46 may be surrounded by the 2-valued unit cells 47 and the 3-valued unit cells 48. The 2-valued unit cells 47 may be disposed between the 1-valued unit cells 46 and the 3-valued unit cells 48. The 3-valued unit cells 48 may surround the 2-valued unit cells 47. The 0-valued unit cells 45 may be disposed outside of the 3-valued unit cells 48. The unit cells 45 to 48 may correspond to regions of photoresist irradiated with the beams 20 having second dose values of 0, 1, 2 and 3, respectively. The dose values of 0 to 3 are normalized values. The dose values of the unit cells 45 to 48 of the second dose map thus are a collection of values (of 0 to 3 in this example) different from the collection of dose values (of 0 and 1 in this example) of the unit cells 34 of the first dose map, but which may be produced by adding respective ones of the first dose values to one another. 2.0 may be a value of two times the based dosed. 3.0 may be a value of 3 times the based dose.

In general, though, the second dose map 44 may have unit cells having 128 to 1024 levels of normalized dose values between the normalized dose values of 0 and 1.

Referring to the illustrated example, though, the first dose region 42a of the second exposure pattern 40 corresponds to the 1-valued unit cells 46, second dose region 42b corresponds to the 2-valued unit cells 47, and third dose region 42c corresponds to the 3-valued unit cells 48.

The magnitude of the dose values of second dose map 44 may be less than those of the dose values of the first dose map 34 at least insofar as those representing the second exposure pattern 40 are concerned. The second dose map 44 may have dose values of greater granularity compared with the first dose map 34. Moreover, the second dose map 44 may set out an exposure process of a duration less than that of the exposure process represented by the first dose map 34. The second dose map 44 may thus offer an improved productivity of the exposure process compared with the first dose map 34. In other words, the second dose map 44 may be employed to minimize production costs of the reticle.

The second dose map 44 representing the second exposure pattern 40 may be produced by applying an inversion function to the target pattern 16. The inversion function includes an inversion operator. The relationship between the inversion operator, the target pattern 16 and the second dose map 44 may be represented by Equation 1 below.

$$F^{-1}(T) = D(x, y) \quad \text{[Equation 1]}$$

wherein $F^{-1}$ represents the inversion operator, T represents the target pattern 16, and D(x, y) corresponds to the second dose map 44. More particularly, T may be unit cells of the target pattern 16. $F^{-1}(T)$ may be an inversion function in which the target pattern 16 is a variable. As described above, the inversion function of the target pattern 16 may produce the second dose map 44. The inversion function may be calculated from a forward function. The forward function may be produced based on Equation 2 below.

$$F(D_0(x,y)) = M \quad \text{[Equation 2]}$$

wherein F is a forward operator, $D_0(x, y)$ represents the first dose map 34, and M corresponds to the mask pattern 13. $F(D_0(x, y))$ is thus a forward operating value of the first dose map 34. The forward operating value may reflect variables in the photolithography process for forming the mask pattern 13.

The first dose map 34 may be converted into the second dose map 40 by a cost function represented by Equation 3 below.

$$\Psi_{initial} = (\Psi(D_0(x, y))) \quad \text{[Equation 3]}$$
$$\vdots$$
$$\Psi_{minimized} = (\Psi(D(x, y)))$$

wherein $\Psi_{initial}$ is an initial cost function. $\Psi(D_0(x, y))$ is a cost function $\Psi$ of the first dose map 34. The initial cost function $\Psi_{initial}$ may be substantially the same as a cost function of the first dose map 34, i.e., $\Psi(D_0(x, y))$. The first dose map 34 may determine the initial cost function $\Psi_{initial}$.

$\Psi_{minimized}$ may be a minimized cost function. $\Psi(D(x, y))$ may be a cost function $\Psi$ of the second dose map 44. The ⋮ symbol indicates iterative calculations of the cost function $\Psi$ and the second dose map 44. The cost function of the second dose map 44, i.e., $\Psi(D(x, y))$, may be calculated into the minimized cost function $\Psi_{minimized}$ by the iterative calculations. The number of dose values, which are allowed in calculation of the cost function $\Psi$ and the second dose map 44, may be critical factors for determining, for example, the size of unit cell, the number of exposure passes, accuracy of critical dimension, and resolution. For instance, the number of allowed dose values in the MBMW exposure correction method may be 128 to 1024. In this case, the cost function $\Psi$ may depend on the kind or type of exposure apparatus and/or process conditions. The cost function $\Psi$ may be determined by, for example, the number of beams 20, power, depth of focus, speed of scanning, and number of repetitions of a scan.

In one example, the cost function $\Psi$ comprises a cost term and constraint terms. The cost term reflects cost factors that are desired to be minimized. The constraint terms reflect optimized factors of the exposure process. For example, the constraint terms may be represented by the product of coefficients and constraint functions. The cost function $\Psi$ may be calculated in one of one-dimensional and two-dimensional fashions.

An example of a cost function calculated in a one-dimensional fashion is represented by Equation 4 below.

$$\Psi = \chi^2 + \lambda_1 F_1 + \lambda_2 F_2 \quad \text{[Equation 4]}$$

wherein $\chi^2$ is a cost term, $\lambda_1 F_1$ is a first constraint term, and $\lambda_2 F_2$ may is a second constraint term.

For example, the cost term $\chi^2$ comprises a chi-squared distribution function. The cost term $\chi^2$ may correspond to $\Sigma(1/\text{slope})^2$ which is a sum of squares of inverse of a slope between unit cells at edges of at least one of the first exposure pattern 30 and the second exposure pattern 40. The slope is representative of differences of the dose values of the unit cells. In the cost function $\Psi$, differences of dose values between unit cells at the edge of the second exposure pattern 40 may increase whenever the iterative calculation is made.

The first constraint term $\lambda_1 F_1$ may be a fixed value of input dose, wherein $\lambda_1$ is a first Lagrange polynomial and $F_1$ is a first constraint function. The first constraint function $F_1$ may correspond to $\int dx \cdot dy \{D_i(x, y)\} - C$ which indicates a value obtained by subtracting a settled value of input dose from a total value of doses in an arbitrary $i^{th}$ second dose map 44 represented by $D_i(x, y)$. The integral $\int dx \cdot dy \{D_i(x, y)\}$ may yield a total value of doses in the second dose map 44. The settled value of input dose may be a constant C. When the first constraint term $\lambda_1 F_1$ is zero, the minimized cost function $\Psi_{minimized}$ may be obtained.

The second constraint term $\lambda_2 F_2$ may satisfy a minimum dose value at the minimum line width 13a, wherein $\lambda_2$ is a second Lagrange polynomial, and $F_2$ is a function of a minimized dose value required for the minimized line width 13a. $F_2$ may correspond to $\Sigma[(D(j)+D(j+1)/2-\text{threshold value}]^2$ which is a sum of squares of a value obtained by subtracting the threshold value from a mean dose value of an arbitrary $j^{th}$ unit cell and a $(j+1)^{th}$ unit cell adjacent thereto in the $i^{th}$ second dose map 44 represented by $D_i(x, y)$. The threshold value may be a minimized dose value required for the represented region to develop in the solution used in the photolithography process. For example, the threshold value may be 0.5. The second constraint term $\lambda_2 F_2$ may be zero when the second Lagrange polynomial $\lambda_2$ satisfies the second constraint function $F_2$. When the second constraint term $\lambda_2 F_2$ is zero, the minimized cost function $\Psi_{minimized}$ may be obtained.

An example of the cost function calculated in a two-dimensional fashion is represented by Equation 5 below.

$$\Psi = \chi^2 + w_1 F_1 + w_2 F_2 + w_3 F_3 \quad \text{[Equation 5]}$$

wherein $\chi^2$ is a cost term, $w_1 F_1$ may is a first constraint term, $w_2 F_2$ is a second constraint term, and $w_3 F_3$ is a third constraint term.

The first constraint term $w_1 F_1$ may be a minimized value of input dose. In the first constraint term, $w_1$ is a first weight having a value of about 1000 to about 3000, for example. The first weight $w_1$ may correspond to the first Lagrange polynomial $\lambda_1$. $F_1$ may be a first constraint function corresponding to $D_i(x, y)\}-C$, i.e., a function in which a settled value of input dose is subtracted from a total value of doses in an arbitrary $i^{th}$ second dose map 44 represented by $D_i(x, y)$. The first constraint term $w_1 F_1$ may be zero when the first weight $w_1$ satisfies the first constraint function $F_1$. When the first constraint term $w_1 F_1$ is zero, the minimized cost function $\Psi_{minimized}$ may be obtained.

The second constraint term $w_2 F_2$ may be used to represent a minimum dose value at the minimum line width 13a. In the second constrain term, $w_2$ is a second weight having a value of about 100 to about 500, for example. The second weight $w_2$ may correspond to the second Lagrange polynomial $\lambda_2$. $F_2$ may be a second constraint function. $F_2$ may be a function of a minimized dose value required for the minimized line width 13a. The second constraint term $w_2 F_2$ may be zero when the second weight $w_2$ satisfies the second constraint function $F_2$. When the second constraint term $w_2 F_2$ is zero, the minimized cost function $\Psi_{minimized}$ may be obtained.

The third constraint term $w_3 F_3$ may relate to the threshold value. In the third constraint term, $w_3$ is a third weight having a value of, for example, about 100 to about 500. $F_3$ is a third constraint function. The third constraint function $F_3$ may correspond to $\Sigma(D(j)-(0.5+\alpha))^2$, i.e., a sum of squares of a value obtained by subtracting $0.5+\alpha$ from a dose value of $j^{th}$ unit cell in the $i^{th}$ second dose map 44 represented by $D_i(x, y)$. The third constraint term $w_3 F_3$ may be zero when the third weight $w_3$ satisfies the third constraint function $F_3$. When the third constraint term $w_3 F_3$ is zero, the minimized cost function $\Psi_{minimized}$ may be obtained.

An example of an exposure method according to the present inventive concepts, using the cost function $\Psi$ obtained by either method described above, for example, will now be described in more detail with reference to FIGS. 1 to 14 and the flowchart of FIG. 15. The exposure method may be executed by an exposure apparatus under the control of a controller or a server connected to the controller.

Figure 15:
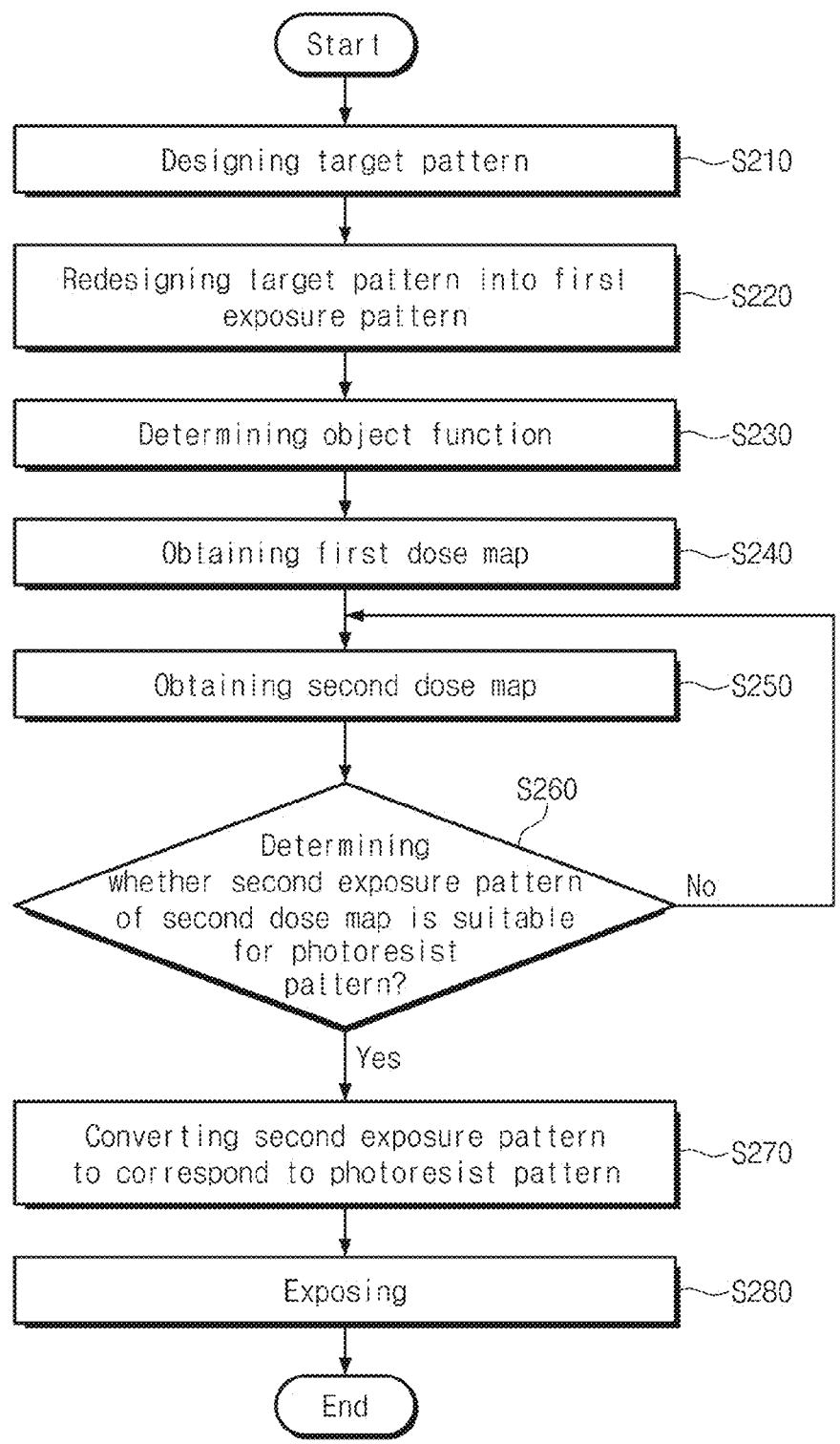
FIG. 15 is a flow chart of an exposure method according to the present inventive concept.

Referring to FIG. 15 together with FIGS. 1 to 14, the target pattern 16 may be designed (S210). The target pattern 16 may correspond to the mask pattern 13 to be formed on a reticle.

The target pattern 16 may be redesigned, i.e., corrected, to form the first exposure pattern 30 (S220). For example, the first exposure pattern 30 may be created from the target pattern 16 by a hotspot extraction technique. The first exposure pattern 30 may have edges and/or corners different from those of the target pattern 16. For example, a sharp corner of the target pattern 16 may be changed into a rounded corner 32 of the first exposure pattern 30.

An object function may be used to convert the first exposure pattern 30 into the second exposure pattern 40 (S230). For example, the object function may be the cost function $\Psi$. As formerly described, the cost function $\Psi$ may be a function for converting the first exposure pattern 30 into the second exposure pattern 40 by an iterative process.

The first dose map 34 may be obtained. The first dose map may be representative of the first exposure pattern 30 (S240). The first dose map 34 may comprise the unit cells 38 each having a dose value of 0 and the unit cells 36 each having a dose value of 1. The 1-valued unit cells 36 may be arranged in the shape of the first exposure pattern 30. Alternatively, the first dose map 34 may be obtained and thereafter the cost function $\Psi$ may be determined.

The second dose map 44 may be obtained using the cost function $\Psi$ and the first dose map 34 (S250). The initial cost function $\Psi_{initial}$ may represent the first dose map 34.

A determination may be made as to whether the second exposure pattern 40 represented by the second dose map 44 is suitable for use in forming the photoresist pattern 15 (S260). If the second exposure pattern 40 is unsuitable for use in forming the photoresist pattern 15, another version of the second dose map 44 may be obtained (produced). The step S250 of obtaining the second dose map 44 and the determining step S260 may be performed by repeatedly calculating the minimized cost function $\Psi_{minimized}$ from the initial cost function $\Psi_{initial}$. When the minimized cost function $\Psi_{minimized}$ is iteratively derived from the initial cost function $\Psi_{initial}$, the optimum second exposure pattern 40 may be obtained.

Once the second dose map 44 and the second exposure pattern 40 have been obtained, the second exposure pattern 40 may be converted to a representation of the photoresist pattern 15 (S270). For example, a point spread function may be used for convolution of (functions representative of) the second exposure pattern 40. The point spread function may be a function defining the depth of focus of the beams 20. The point spread function may determine a slope of sides of the photoresist pattern 15. The point spread function may comprise a Gaussian function.

The photoresist 14 may be exposed to the beams 20 in accordance with the convolution of (a function representative of) the second exposure pattern 40 (S280).

Figure 16:
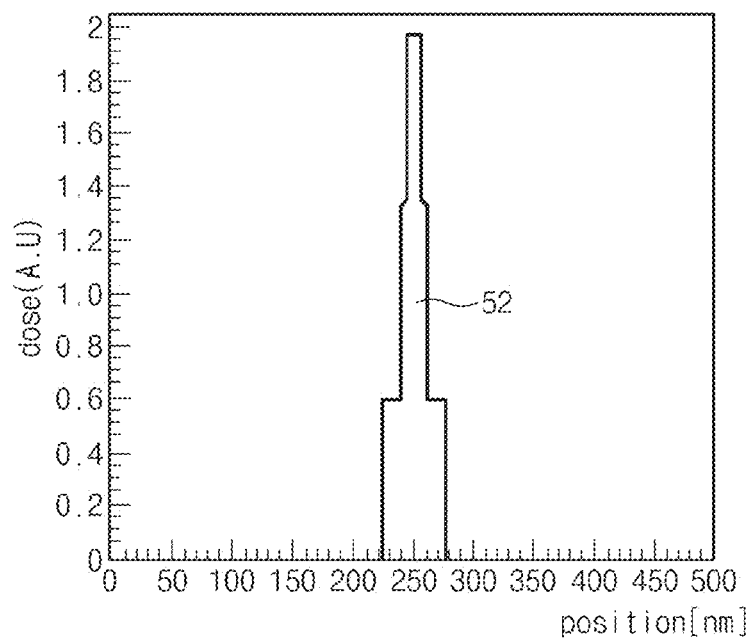
FIG. 16 is a graph of dose values of an example of the second exposure pattern having a line width of about 50 nm derived using a one-dimensional cost function.
Figure 17:
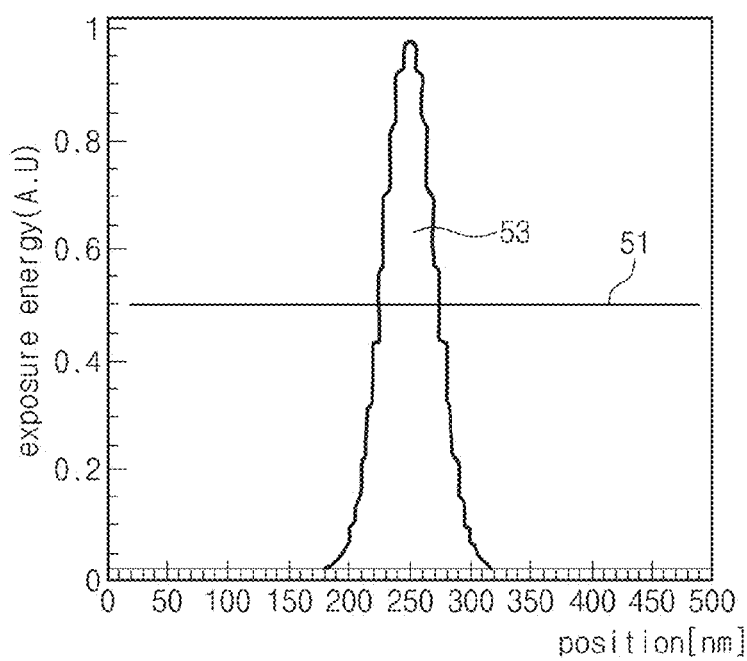
FIG. 17 is a graph of a latent image of the second exposure pattern obtained by convoluting the plot of the graph of FIG. 16.

FIG. 16 is a graph of dose values of the second exposure pattern 40 having a line width of about 50 nm, calculated using the one-dimensional cost function $\Psi$. FIG. 17 is a graph obtained by convolution of a representation of the plot 52 of the graph of FIG. 16.

Referring to FIGS. 16 and 17, the dose value plot 52 may have a bell-like shape. The latent image graph may be indicative of the exposure energy accumulated in the photoresist 14. That is, the latent image plot 53 may be a quantification of the exposure energy. The latent image plot 53 may have a shape similar to that of the dose value graph 52. The latent image plot 53 may have a width greater than that of the dose value plot 52. The width of the bell-shaped plot of the latent image plot 53 may correspond to a distance between features (i.e., lines in this example) of the photoresist pattern 15. At a threshold value 51, the latent image plot 53 may have a width of about 50 nm which is substantially the same as that of the dose value plot 52. The threshold value 51 may be 0.5.

Figure 18:
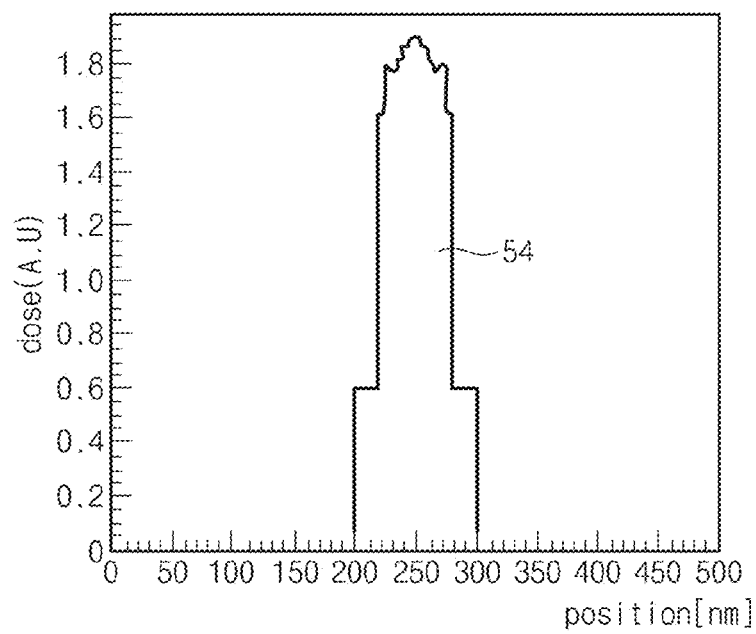
FIG. 18 a graph showing dose values of an example of the second exposure pattern having a line width of 100 nm derived using a one-dimensional cost function.
Figure 19:
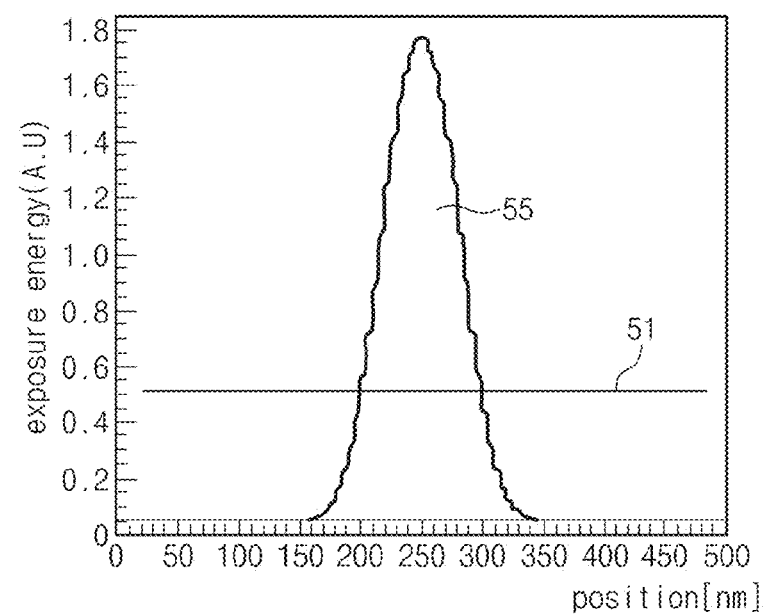
FIG. 19 is a graph of a latent image of the second exposure pattern obtained by convoluting the plot of the graph of FIG. 18.

FIG. 18 a graph of dose values of the second exposure pattern 40 having a line width of about 100 nm that are calculated using the one-dimensional cost function $\Psi$. FIG. 19 is a graph obtained by convolution of a representation of the plot 54 of the graph of FIG. 18.

Referring to FIGS. 18 and 19, the dose value plot 54 may have a bell-like shape. The latent image plot 55 may have a width greater than that of the dose value plot 54. At the threshold value 51, the latent image plot 55 may have a width of about 100 nm which is substantially the same as that of the dose value plot 54.

Figure 20:
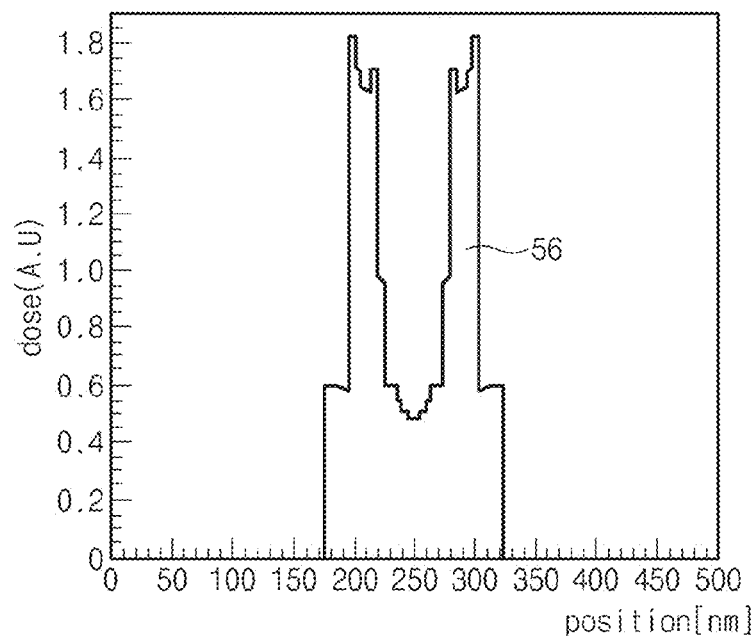
FIG. 20 is a graph showing dose values of an example of the second exposure pattern having a line width of 150 nm derived using a one-dimensional cost function.
Figure 21:
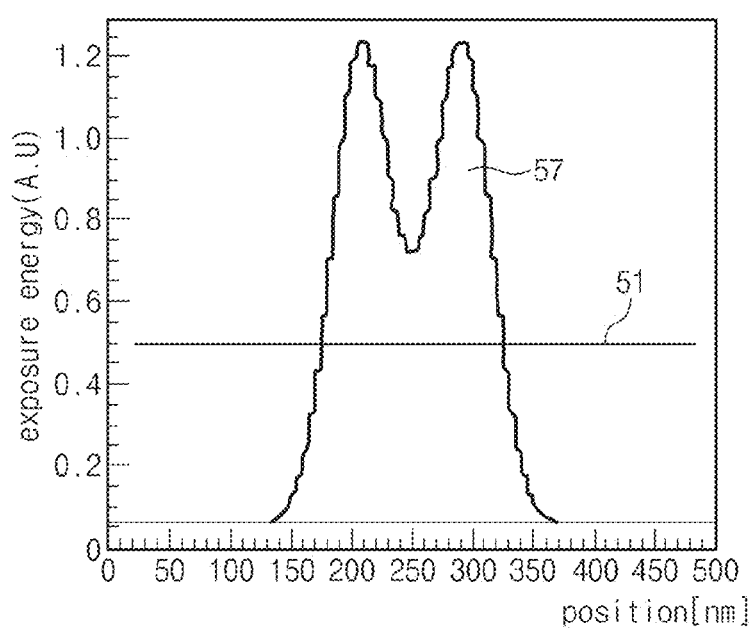
FIG. 21 is a graph of a latent image of the second exposure pattern obtained by convoluting the plot of the graph of FIG. 20.

FIG. 20 is a graph 56 of dose values of the exposure pattern 40 having a line width of about 150 nm that are calculated using the one-dimensional cost function Ψ. FIG. 21 is a graph obtained by a convolution of a representation of the plot 56 of the graph of FIG. 20.

Referring to FIGS. 20 and 21, the dose value plot 56 may have an "M"-like shape representing dose values of the second exposure pattern 40 having a line width of about 150 nm. In the second exposure pattern 40 having the line width of about 150 nm, dose values at edges of the pattern in the direction of the line width are greater than a dose value at a center of the pattern. The latent image plot 57 may have a maximum width greater than that of the dose value plot 56. At the threshold value 51, the latent image plot 57 may have a width of about 150 nm which is substantially the same as the maximum width of the dose value plot 56.

Figure 22:
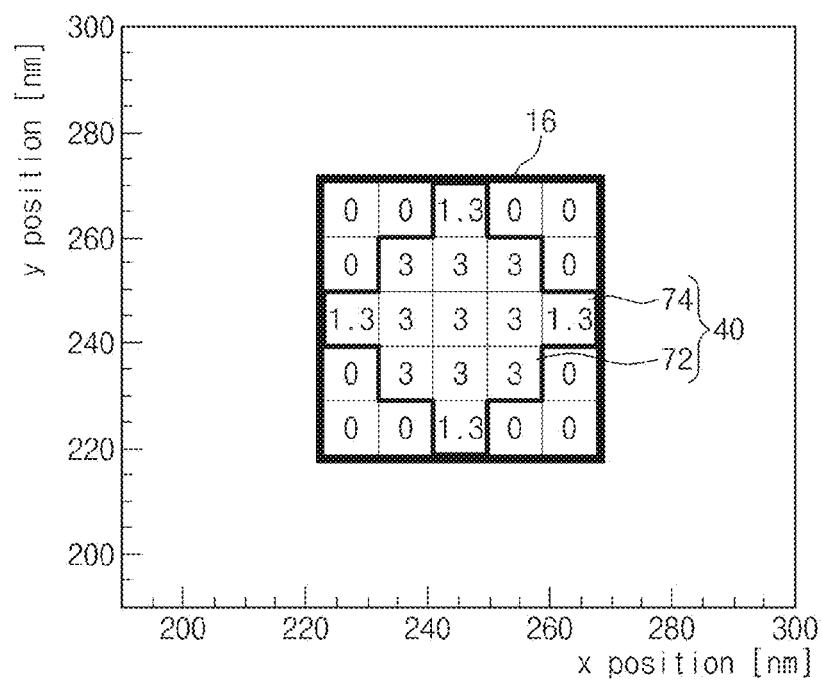
FIG. 22 illustrates an example of the target pattern whose shape is a regular tetragon measuring 50 nm×50 nm, and a second exposure pattern derived using a two-dimensional cost function.
Figure 23:
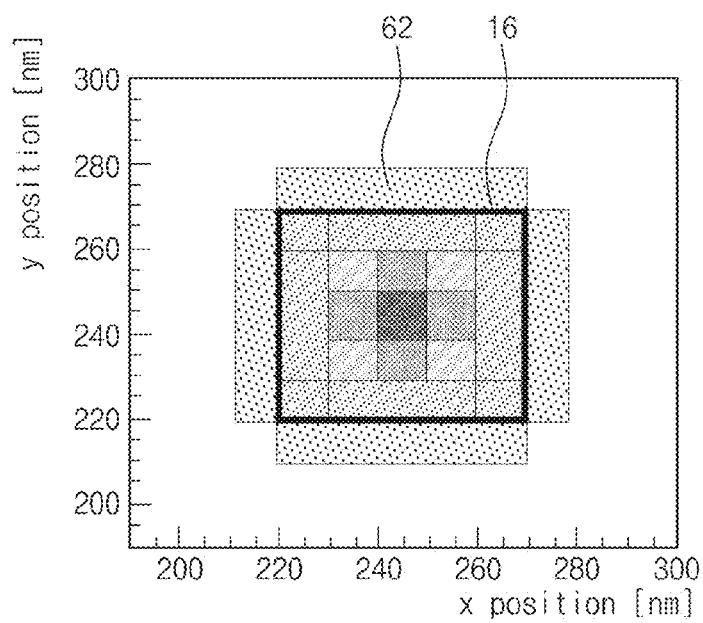
FIG. 23 illustrates a latent image obtained by convoluting a representation of the second exposure pattern of FIG. 22 using an electron beam energy distribution function.

FIG. 22 illustrates an example in which the target pattern 16 has the shape of a regular tetragon measuring 50 nm×50 nm, and the second exposure pattern 40 is derived using the two-dimensional cost function Ψ. FIG. 23 illustrates a latent image 62 obtained by convoluting a representation of the second exposure pattern 40 of FIG. 22 with an electron beam energy distribution function.

Referring to FIG. 22, the second exposure pattern 40 may have an area less than that of the 50 nm×50 nm target pattern 16. The second exposure pattern 40 may be located in the target pattern 16. The target pattern 16 may have a regular tetragonal shape. The second exposure pattern 40 may have a shape different from that of the target pattern 16. The second exposure pattern 40 may be horizontally (or X-directionally) and longitudinally (or Y-directionally) symmetric with respect to its center. In other words, the second exposure pattern 40 may have a rotational symmetry about its center. The second exposure pattern 40 may comprise 3-valued unit cells 72 and 1.3-valued unit cells 74. The 3-valued unit cells 72 and the 1.3-valued unit cells 74 may respectively have areas each measuring 10 nm×10 nm. The 3-valued unit cells 72 may respectively have a dose value of 3. The dose value of 3 may be 3 times the based value. The 1.3-valued unit cells 74 may respectively have a dose value of 1.3. The dose value of 1.3 may be 1.3 times the based dose. The 3-valued unit cells 72 may be disposed at a central portion of the second exposure pattern 40. The 1.3-valued unit cells 74 may be located at the periphery of the second exposure pattern 40 in directions perpendicular to each other and intersecting at the center of the second exposure pattern 40 (e.g., in X and Y directions). Dose values of the 3-valued unit cells 72 and the 1.3-valued unit cells 74 may be distributed in an "A"-shape along the directions perpendicular to each other and intersecting at the center of the second exposure pattern 40. Accordingly, the second exposure pattern 40 may represent a pattern produced with dose values of a cross product of A, i.e., A⌞A. The cross product may be the product of distribution functions of cross sections each in a respective one of two dimensions, i.e., f(x, y)=g(x) ⌞ h(y).

Referring to FIGS. 22 and 23, the latent image 62 may have two-dimensional form. The latent image 62 may be indicative of exposure energy accumulated in the photoresist 14. The latent image 62 may have a size greater than those of the second exposure pattern 40 and the target pattern 16. The latent image 62 may have a dose profile having a shape of a cross product of A, i.e., A⌞A.

Figure 24:
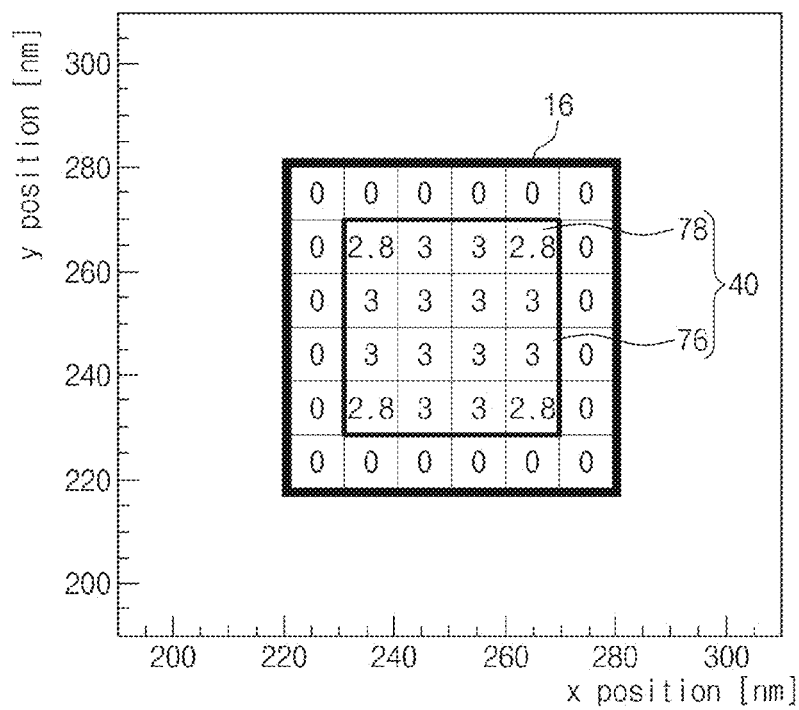
FIG. 24 illustrates an example of a target pattern whose shape is a regular tetragon measuring 60 nm×60 nm and a second exposure pattern derived using a two-dimensional cost function.
Figure 25:
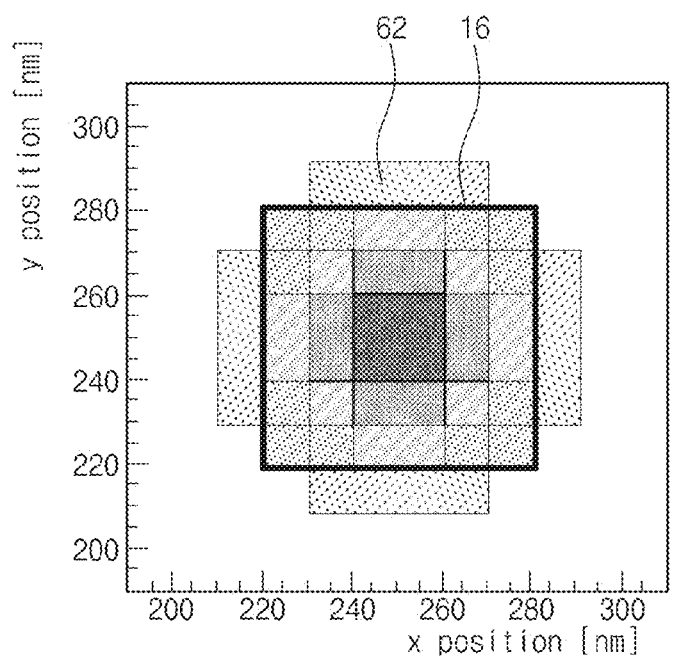
FIG. 25 illustrates a latent image obtained by convoluting a representation of the second exposure pattern of FIG. 24 using an electron beam energy distribution function.

FIG. 24 illustrates an example in which the target pattern 16 has a shape of a regular tetragon measuring 60 nm×60 nm and the second exposure pattern 40 is derived using the two-dimensional cost function Ψ. FIG. 25 illustrates a latent image 62 obtained by convoluting a representation of the second exposure pattern 40 of FIG. 24 with an electron beam energy distribution function.

Referring to FIG. 24, the second exposure pattern 40 may have an area less than that of the 60 nm×60 nm target pattern 16. The second exposure pattern 40 may have a shape substantially the same as that of the target pattern 16. The second exposure pattern 40 may have a regular tetragonal shape. The second exposure pattern 40 may comprise unit cells 76 each having a dose value of 3 and unit cells 78 each having a dose value of 2.8. The dose value of 2.8 may be 2.8 times the based dose. The 2.8-valued unit cells 78 may be disposed at corners of the second exposure pattern 40. The 3-valued unit cells 76 may be arranged symmetrically with respect to each of two perpendicular axes.

Referring to FIGS. 24 and 25, the latent image 62 may be obtained by convoluting a representation of the second exposure pattern 40 with an electron beam energy distribution function. The latent image 62 may have a size greater than those of the second exposure pattern 40 and the target pattern 16.

Figure 26:
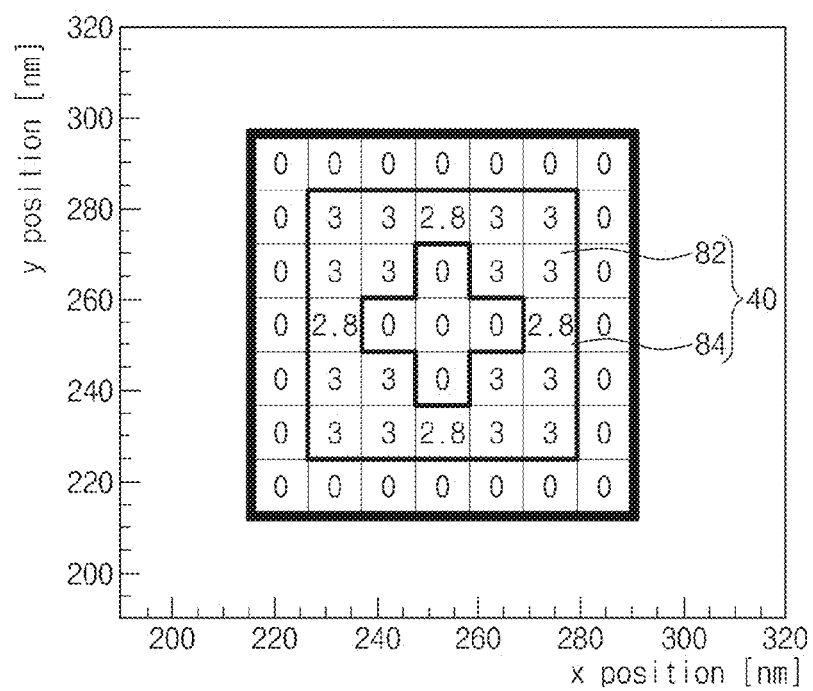
FIG. 26 illustrates an example of a target pattern whose shape is a regular tetragon measuring 70 nm×70 nm and a second exposure pattern derived using a two-dimensional cost function.
Figure 27:
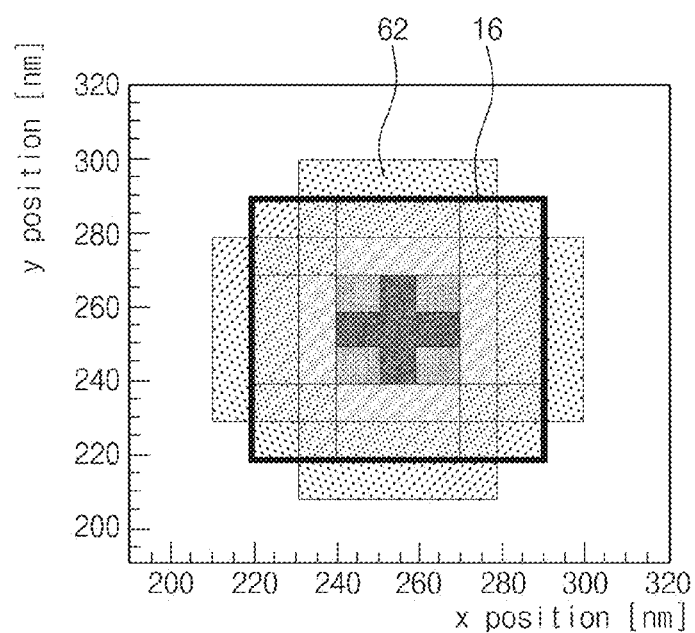
FIG. 27 illustrates a latent image obtained by convoluting a representation of the second exposure pattern of FIG. 26 using an electron beam energy distribution function.

FIG. 26 illustrates an example in which the target pattern 16 has the shape of a regular tetragon measuring 70 nm×70 nm and the second exposure pattern 40 is calculated using the two-dimensional cost function Ψ. FIG. 27 illustrates a latent image 62 obtained by convoluting a representation of the second exposure pattern 40 of FIG. 26 with an electron beam energy distribution function.

Referring to FIG. 26, the second exposure pattern 40 may have an area and/or a size less than those of the 70 nm×70 nm target pattern 16. The second exposure pattern 40 may be disposed in the target pattern 16. The second exposure pattern 40 may have a shape of a hollow regular tetragon, i.e., a regular tetragon with a hollow center. The second exposure pattern 40 may comprise unit cells 82 each having a dose value of 3 and unit cells 84 each having a dose value of 2.8. The second exposure pattern 40 may have a central portion on which the 3-valued unit cells 82 and the 2.8-valued unit cells 84 are not provided. The 3-valued unit cells 82 may be arranged along diagonal directions in the second exposure pattern 40. The 2.8-valued unit cells 84 may be arranged along perpendicular (X and Y) directions intersecting at a center of the second exposure pattern 40. Dose values of the 2.8-valued unit cells 84 may be distributed in an "M"-shape in the perpendicular (X and Y) directions intersecting at the center of the second exposure pattern 40. The second exposure pattern 40 may have dose values distributed to have a shape expressed by a cross product of M, i.e., M⌞M in the perpendicular (X and Y) directions intersecting at the center of the second exposure pattern 40.

Referring to FIGS. 26 and 27, the latent image 62 may be obtained by convoluting a representation of the second exposure pattern 40 using an electron beam energy distribution function. The latent image 62 may have a size greater than those of the second exposure pattern 40 and the target pattern 16. The latent image 62 may have a dose profile having a shape of a cross product of M, i.e., M⌞M.

Figure 28:
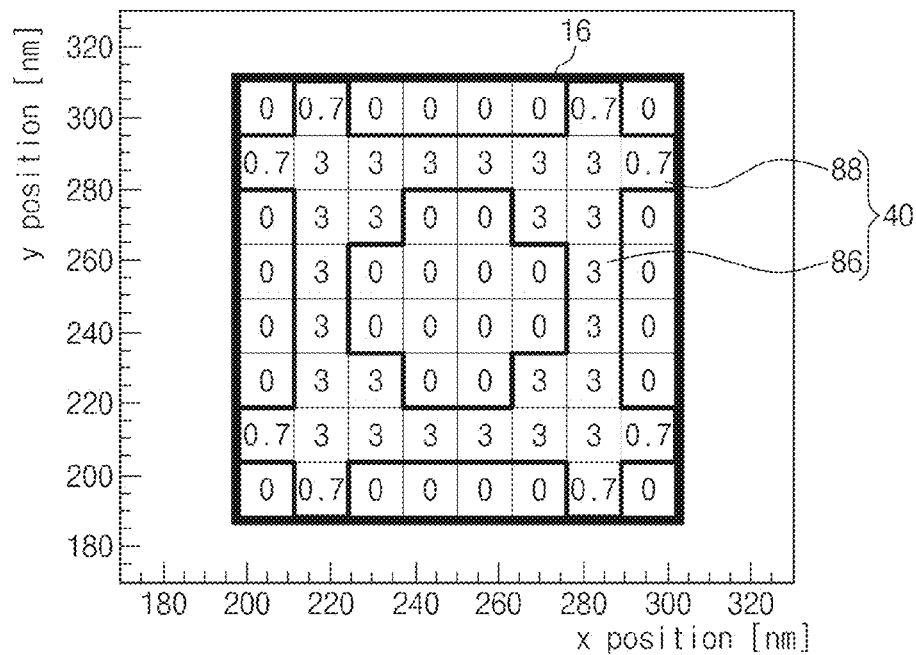
FIG. 28 illustrates an example of a target pattern whose shape is a regular tetragon measuring 80 nm×80 nm and a second exposure pattern derived using a two-dimensional cost function.
Figure 29:
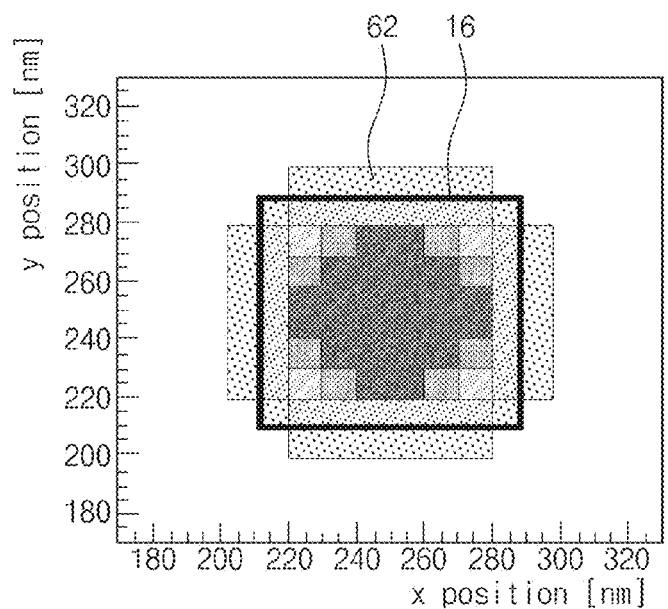
FIG. 29 illustrates a latent image obtained by convoluting a representation of the second exposure pattern of FIG. 28 using an electron beam energy distribution function.

FIG. 28 illustrates an example in which the target pattern 16 has the shape of a regular tetragon measuring 80 nm×80 nm and the second exposure pattern 40 is derived using the two-dimensional cost function Ψ. FIG. 29 illustrates a latent image 62 obtained by convoluting the second exposure pattern 40 of FIG. 28 using an energy distribution function of electron beam.

Referring to FIG. 28, the second exposure pattern 40 may have an area less than that of the 80 nm×80 nm target pattern 16. The second exposure pattern 40 may be disposed in the target pattern 16. The second exposure pattern 40 may comprise unit cells 86 each having a dose value of 3 and unit cells 88 each having a dose value of 0.7. The dose value of 0.7 may be 0.7 times the based dose. The second exposure pattern 40 may have a central portion at which the 3-valued unit cells 86 are provided. The 3-valued unit cells 86 may be arranged in the shape of a regular but hollow tetragon. The 3-valued unit cells 86 may have an "M"-shaped distribution of dose values with respect to perpendicular (X and Y) directions intersecting at a center of the second exposure pattern 40. The 0.7-valued unit cells 88 may be disposed at corners of the second exposure pattern 40.

Referring to FIGS. 28 and 29, the latent image 62 may be obtained by convoluting a representation of the second exposure pattern 40 using an electron beam energy distribution function. The latent image 62 may have a size greater than those of the second exposure pattern 40 and the target pattern 16.

Figure 30:
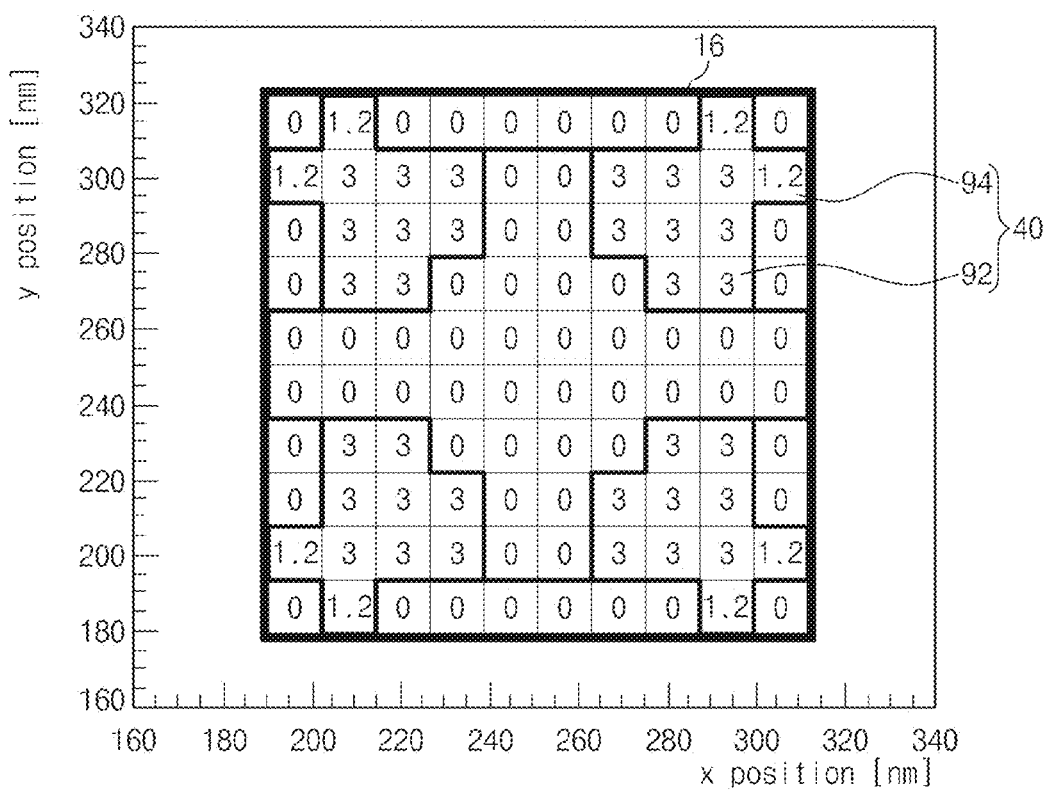
FIG. 30 illustrates an example of a target pattern whose shape is a regular tetragon measuring 100 nm×100 nm and a second exposure pattern derived using a two-dimensional cost function.
Figure 31:
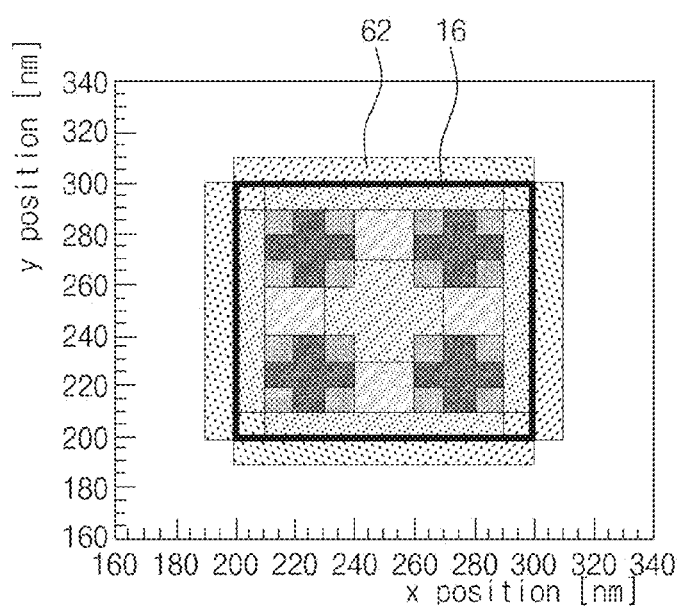
FIG. 31 illustrates a latent image obtained by convoluting a representation of the second exposure pattern of FIG. 30 using an electron beam energy distribution function.

FIG. 30 illustrates an example in which the target pattern 16 has the shape of a regular tetragon measuring 100 nm×100 nm and the second exposure pattern 40 is derived using the two-dimensional cost function $\Psi$. FIG. 31 illustrates a latent image 62 obtained by convoluting a representation of the second exposure pattern 40 of FIG. 30 using an electron beam energy distribution function.

Referring to FIG. 30, the second exposure pattern 40 may have an area less than that of the 100 nm×100 nm target pattern 16. The second exposure pattern 40 may be disposed in the target pattern 16. The second exposure pattern 40 may comprise unit cells 92 each having a dose value of 3 and unit cells 94 each having a dose value of 1.2. The dose value of 1.2 may be 1.2 times the based dose. The 3-valued unit cells 92 and the 1.2-valued unit cells 94 respectively may be arranged along diagonal directions in the second exposure pattern 40.

More specifically, the 3-valued unit cells 92 may be disposed along the diagonal directions in the second exposure pattern 40. The 1.2-valued unit cells 94 may be disposed along perpendicular directions originated from corners of the second exposure pattern 40. Dose values of the 3-valued unit cells 92 and the 1.2-valued unit cells 94 may be distributed in an "M"-shape with respect to the perpendicular directions originating from the corners of the second exposure pattern 40.

Referring to FIGS. 30 and 31, the latent image 62 may be obtained by convoluting a representation of the second exposure pattern 40 using an electron beam energy distribution function. The latent image 62 may have a size greater than those of the second exposure pattern 40 and the target pattern 16. The latent image 62 may have a dose profile having a shape of a cross product of U, i.e., $U \sqcup U$.

As described above, according to an aspect of the inventive concept, a first dose map of first dose values of beams to expose a layer of photoresist is obtained, and is used to then obtain an optimum second dose map of dose values greater of less than the first dose values.

Although the inventive concept has been described in connection with examples illustrated in the accompanying drawings, it will be apparent to those skilled in the art that various substitutions, modifications and changes may be to the examples without departing from the scope and spirit of the inventive concept.

What is claimed is:

1. An exposure method comprising:
providing a substrate having a layer of photoresist thereon;
designing a target pattern to be formed on the substrate;
creating a first dose map of first dose values, wherein the first dose values are representative of doses of energy of beams emitted by a light source of an exposure apparatus, and the first dose map includes a representation of a corrected version of the target pattern;
creating a second dose map of second dose values, different from the first dose values, wherein at least some of the second dose values correspond to values of doses of energy produced by overlapping ones of the beams;
controlling the light source of the exposure apparatus to irradiate respective regions of the layer of photoresist in such a way that said respective regions are exposed to doses of energy having values based on the second dose values to thereby alter said regions of the layer of photoresist; and
determining a cost function before or after obtaining the first dose map,
wherein the cost function is converted into a minimum cost function by repeatedly calculating the first dose map and the second dose map, the second dose map calculated by the minimum cost function,
wherein the cost function comprises a constraint term comprising input dose values of a first exposure pattern and minimum dose values given to a minimum line width of the first exposure pattern, and
wherein the constraint term comprises
a first constraint term including a fixed input dose value which is provided to the first exposure pattern, and
a second constraint term providing a second dose value corresponding to a minimum dose value at the minimum line width.

2. The method of claim 1, wherein the constraint term comprises a product of a Lagrange polynomial and a constraint function,
wherein the cost function becomes minimized when the product of the Lagrange polynomial and the constraint function is zero.

3. The method of claim 1, wherein the second dose map comprises a second exposure pattern including unit cells which correspond to the second dose values, and
wherein the target pattern has a line width of substantially 50 nm, and dose values of the second exposure pattern are distributed in a bell shape in a direction of the line width.

4. The method of claim 1, wherein the second dose map comprises a second exposure pattern including unit cells which correspond to the second dose values, and
wherein the target pattern has a line width of about 150 nm, dose values of the second exposure pattern are distributed in an "M" shape in a direction of the line width.

5. The method of claim 1, wherein the second dose map comprises a second exposure pattern of unit cells which correspond to the second dose values, and
wherein the target pattern has a regular tetragonal shape of substantially 50 nm×50 nm, and the unit cells are provided with dose values of A cross product A in a first direction and a second direction.

6. The method of claim 1, wherein the second dose map comprises a second exposure pattern including unit cells which correspond to the second dose values, and
wherein the target pattern has a regular tetragonal shape of substantially 70 nm×70 nm, and the unit cells are provided with dose values of M cross product M in a first direction and a second direction.

7. The method of claim 1, wherein the second dose map comprises a second exposure pattern including unit cells which correspond to the second dose values, and
wherein the target pattern has a regular tetragonal shape of substantially 100 nm×about 100 nm, and the unit cells are provided with dose values of U cross product U in a first direction and a second direction.

8. The method of claim 1, further comprising redesigning the target pattern to form the first exposure pattern of the photoresist,
wherein the first dose values correspond to unit cells of the first exposure pattern.

9. The method of claim 8, wherein the cost function further comprises:
a cost term minimizing the second dose values at an edge of the first exposure pattern.

10. The method of claim 9, wherein the cost term comprises a chi-squared distribution function, the chi-squared distribution function calculated by summing squares of an inverse of differences between the first dose values corresponding to the unit cells at edges of the first exposure pattern.

11. The method of claim 9, wherein the cost function comprises a one-dimensional cost function and a two-dimensional cost function.

12. The method of claim 11, wherein the two-dimensional cost function comprises:
the first constraint term;
the second constraint term; and
a third constraint term satisfying a condition of threshold dose value by which the photoresist is exposed.

13. A method of manufacture comprising:
forming a layer of photoresist on a substrate;
exposing the photoresist to beams of energy emitted by a light source of an exposure apparatus; and
developing the exposed photoresist to form a photoresist pattern,
wherein exposing the photoresist comprises:
designing a target pattern to be formed on the substrate;
creating a first dose map of first dose values, wherein the first dose values are representative of doses of energy of individual ones of beams emitted by the light source of the exposure apparatus, and the first dose map includes a representation of a corrected version of the target pattern;
creating a second dose map of second dose values, different from the first dose values, wherein at least some of the second dose values correspond to values of doses of energy produced by overlapping ones of the beams; and
controlling the light source of the exposure apparatus to irradiate respective regions of the layer of photoresist in such a way that said respective regions are exposed to doses of energy having values based on the second dose values,
wherein the second dose map is representative of a second exposure pattern including unit cells to which the second values are assigned; and
converting a mathematical representation of the second exposure pattern with a point spread function and using the converted mathematical representation of the second exposure pattern in irradiating the respective regions of the photoresist pattern.

14. The method of claim 13, wherein the target pattern has sharp corners and the first dose map includes a representation of a pattern corresponding to the target pattern but with at least one of the sharp corners being rounded instead.

15. The method of claim 13, wherein the first dose map is representative of a first exposure pattern of unit cells to which the first values are assigned, respectively, and said at least some of the second values are multiples of the first values.

16. The method of claim 15, wherein said at least some of the second values are assigned to unit cells constituting a central portion of the second exposure pattern.

17. The method of claim 15, wherein the second values include values less than those constituting a central portion of the second exposure pattern and assigned to unit cells, respectively, each located at an outer periphery of the second exposure pattern.

18. A method of manufacturing a reticle, comprising:
providing a transparent substrate having a mask layer thereon, and a layer of photoresist on the mask layer;
exposing the layer of photoresist to beams of energy emitted by a light source of an exposure apparatus;
developing the exposed photoresist to form a photoresist pattern; and
etching the mask layer, using the photoresist pattern as an etch mask, to form a mask pattern on the substrate,
wherein exposing the layer of photoresist includes:
designing a target pattern to be formed on the substrate as the mask pattern;
creating a first dose map of first dose values, wherein the first dose values are representative of doses of energy of individual ones of beams emitted by the light source of the exposure apparatus, and the first dose map includes a representation of a corrected version of the target pattern;
creating a second dose map of second dose values, different from the first dose values, wherein at least some of the second dose values correspond to values of doses of energy produced by overlapping ones of the beams; and
controlling the light source of the exposure apparatus to irradiate respective regions of the layer of photoresist in such a way that said respective regions are exposed to doses of energy having values based on the second dose values.

* * * * *